United States Patent [19]
Getzlaff et al.

[11] Patent Number: 5,303,365
[45] Date of Patent: Apr. 12, 1994

[54] CLOCK GENERATION IN A MULTI-CHIP COMPUTERSYSTEM

[75] Inventors: Klaus J. Getzlaff, Schoenaich; Johann Hajdu; Guenter Knauft, both of Boeblingen, all of Fed. Rep. of Germany

[73] Assignee: International Business Machines Corporation, Armonk, N.Y.

[21] Appl. No.: 715,530

[22] Filed: Jun. 14, 1991

[30] Foreign Application Priority Data

Jun. 15, 1990 [EP] European Pat. Off. ........ 90111294.6

[51] Int. Cl.⁵ .............................................. G06F 1/04
[52] U.S. Cl. .................................. 395/550; 364/945.8
[58] Field of Search ............... 395/550; 364/270, 945, 364/8, 947.1, 270.2, 270.3; 307/452, 272.2, 269, 445; 371/61

[56] References Cited

U.S. PATENT DOCUMENTS

| | | | |
|---|---|---|---|
| 4,409,671 | 10/1983 | Daniels et al. | 395/550 |
| 4,419,739 | 12/1983 | Blum | 364/945.8 |
| 4,745,302 | 5/1988 | Hanawa et al. | 307/269 |
| 4,799,040 | 1/1989 | Yanagi | 341/101 |

FOREIGN PATENT DOCUMENTS 5856023 10/1984 Japan.

OTHER PUBLICATIONS

IBM TDB, vol. 31, No. 12, May 1989 On-Chip LSSD Clock Generator with Zero Gap Between Master to Slave Clocks.
IBM TDB, vol. 27, No. 8, Jan. 1985 Synchronization of LSSD System Clocks to Asynchronous Signals.

Primary Examiner—Dale M. Shaw
Assistant Examiner—Moustafa M. Meky
Attorney, Agent, or Firm—Arthur J. Samodovitz

[57] ABSTRACT

The invention relates to a multi-chip computersystem with master-slave latches. It is known to provide all latches on all chips with two clock pulses, respectively. With the help of the latches the digital signals are pipelined through the logic gates on the chip. Due to tolerances, the edges which control the masters and the slaves have a skew. According to the invention, one of the two clock pulses is generated on the chip itself, respectively, by ANDing an auxiliary clock pulse with the other of the two clock pulses. This has the result, that the above mentioned edges of the two clock pulses occur almost at the same time with the consequence that the frequency of the clock pulses can be increased.

6 Claims, 5 Drawing Sheets

CLOCK GENERATION IN A MULTI-CHIP COMPUTERSYSTEM

BACKGROUND OF THE INVENTION

The invention relates to a computer system comprising a clock circuit for generating at least one clock pulse and at least one logic circuit being provided with said clock circuit generated clock pulse, said logic circuit comprising at least one master-slave-latch being provided with two clock pulses.

Such a computer system is known for example from main frame machines and is subsequently described in connection with FIGS. 1 to 4B of the drawings.

FIG. 1 shows a multi-chip computer system which contains a first chip with a clock circuit CLK (10) and further chips with logic circuits (12, 13, 14, 15, 16), respectively. All logic circuits (12, 13, 14, 15, 16) are connected with the clock circuit (10) via at least two lines and receive via these lines a first clock pulse (+C) and a second clock pulse (+B).

FIG. 2 shows a part of the logic circuit (14) which contains two master-slave-latches (30, 31, 35, 36) and a block (33) which stands for a number of logical gates etc. The masters (30, 35) of these two latches are provided with the first clock pulse (+C) via a first clock line (20) and the slaves (31, 36) are provided with the second clock pulse (+B) via a second clock line (21), respectively. Furthermore, an input line (23) is connected to the master (30), the slave (31) is connected with the master (35) via two lines (24, 25) and the slave (36) is provided with an output line (26).

With the help of the timing diagram of the first and second clock pulse (+C, +B) of FIG. 3 the operation of the circuit of FIG. 2 and thus the operation of the logic circuit (14) will now be described.

The lines (23, 24, 25, 26) are assigned to one digital signal which is propagated from one latch (30, 31) to the other (35, 36). Inbetween the two latches (30, 31, 35, 36) the digital signal is supplied to the logical gates of the block (33). Due to these gates the value of the digital signal can be changed on its way to the next latch. The logic circuit (14) is put together of a number of latches which are connected in series for every digital signal and which are arranged in parallel in regard to different digital signals. The logical gates inbetween the latches can be connected with each other and can be supplied with other digital signals, too.

The pipelining of the digital signals is carried out by the latches with the help of their masters (30, 35) and their slaves (31, 36). If, for example, the slave (31) stores a high value of the digital signal then this high value runs through the gates of the block (33) and arrives at the master (35), circumstances permitting a change of the value. The digital signal which has arrived at the master (35) is taken over into the master (35) and is then stored in the slave (36). Now, the digital signal stored in the slave (36) runs through the next following gates and arrives at the next following latch. At the same time, the subsequent digital signal in the pipeline runs through the above mentioned block (33) and arrives at the above mentioned master (35).

As a result, the digital signals are pipelined through all latches and all logical gates, thus carrying out the logic function of the logic circuit (14).

The timing of the pipelining is controlled by the first and the second clock pulse (+C, +B). The first clock pulse (+C) controls the masters (30, 35) and the second clock pulse (+B) controls the slaves (31, 36). The taking over of the arrived digital signal into the master (30, 35) is executed with the falling edge of the first clock pulse (+C). The storing of the digital signal from the master (30, 35) into the slave (31, 36) is executed with the raising edge of the second clock pulse (+B).

As it is shown in FIG. 3 (see 28), in theory it is planned that the falling and raising edge of the first and the second clock pulse (+C, +B) occur simultaneous. This would have the consequence, that the arrived digital signal is taken over into the master (30, 35) and stored in the slave (31, 36) at the same time. In this case, the duration of time (Teff) from the raising edge of the second clock pulse (+B) to the falling edge of the first clock pulse (+B) would be a maximum. As any digital signal needs a running time to run through the gates inbetween the latches this duration of time (Teff) determines the number of gates that can be arranged inbetween two latches. In the present theoretical case, this number of gates would be a maximum, too.

In practice, the falling and the raising edge of the first and the second clock pulse (+C, +B) do not occur simultaneous. This happens due to the tolerances of the different components on the clock circuit (10) which generate the clock pulses (+C, +B), due to different lengths that the clock pulses (+C, +B) have to run from the clock circuit (10) until they arrive at the latches (30, 31, 35, 36), etc. As a consequence and as it is shown in FIG. 3 (see 38), the falling edge of the first clock pulse (+C) and the raising edge of the second clock pulse (+B) can have a skew.

With the help of the timing diagrams of FIGS. 4A and 4B the problems that arise because of that skew will now be described.

FIG. 4A shows the so-called short path problem. In this case, the raising edge of the second clock pulse (+B) occurs prior to the falling edge of the first clock pulse (+C). This has the effect, that a digital signal is stored in the slave (31, 36) with the raising edge of the second clock pulse (+B) and begins to run through the gates of the block (33) at the same moment. With the falling edge of the first clock pulse (+C) the arrived digital signal is taken over into the master (30, 35). The duration of time (Teff') from the raising edge of the second clock pulse (+B) to the falling edge of the first clock pulse (+C) is very short, so that the number of gates can only be very small, too, to ensure a correct function. If the number of gates inbetween the latches is not as small as necessary, then the digital signal which began to run through the gates of the block (33) with the raising edge of the second clock pulse (+B) has not yet arrived at the master (31, 36) in the moment of the falling edge of the first clock pulse (+C), with the consequence, that a faulty signal is taken over into that master (31, 36).

FIG. 4B shows how this source of error is avoided. The falling edge of the first clock pulse (+C) and the raising edge of the second clock pulse (+B) are not generated for being simultaneous but with a gap. The raising edge of the second clock pulse (+B) is generated a duration of time (DT) later than the falling edge of the first clock pulse (+C). This duration of time (DT) is selected at least as great as the skew that can arise in theory in the worst case. As it is shown in FIG. 4B (see 48), due to the gap the raising edge of the second clock pulse (+B) is not prior to the falling edge of the first clock pulse (+C) in any case. The result is that the short path problem is avoided.

On the other hand, because of the gap the duration of time (Teff'') from the raising edge of the second clock pulse (+B) to the falling edge of the first clock pulse (+C) is shorter than in the theoretical case shown in FIG. 3. This effect is called the long path problem. It has the consequence that the number of gates inbetween the latches has to be smaller or the frequency of the clock pulses (+C, +B) has to be decreased for the same number of gates. In any case, the performance of the computersystem is reduced.

SUMMARY OF THE INVENTION

It is an object of the invention to improve the performance of the computersystem in regard of the clock pulses.

According to the invention this object is solved by a computersystem comprising a clock circuit for generating at least one clock pulse and at least one logic circuit being provided with said clock circuit generated clock pulse, said logic circuit comprising means for generating at least one other clock pulse with the help of said clock circuit generated clock pulse and at least one master-slave-latch being provided with two clock pulses one of them being said logic circuit generated clock pulse and the other one being said clock circuit generated clock pulse or its inversion.

The computersystem according to the invention generates at least one of the two clock pulses for the master-slave-latches on the logic circuit itself. The generation is done in dependance of the clock circuit generated clock pulse. This has the result that both clock pulses for the master-slave-latches are derived from to the clock circuit generated clock pulse with the effect that all edges of these two clock pulses are directly dependant on each other and for that reason the edges are nearly identical. Due to that, any skew that comes from tolerances in components or different lengths prior to the logic circuit is ceased to apply. This has the advantage that the skew is reduced tremendously. Only a minor skew due to tolerances of components on the logic circuit itself remains. The same is true for all logic circuits, respectively. As a summary, the duration of time for the digital signals to run through the gates inbetween the latches is a maximum and as a consequence, the number of gates can be a maximum, too. The performance of the computersystem in regard to the clock pulses is increased.

In an embodiment of the invention the means for generating one of the two clock pulses for the master-slave-latches incorporate an AND-gate. This AND-gate is arranged on the logic circuit or on the logic circuits, respectively. With the help of this AND-gate the clock circuit generated clock pulse is combined with another signal that can be supplied to or that can be generated on the logic circuit. The logic circuit generated clock pulse and the clock circuit generated clock pulse are then supplied to the latches as the first and the second clock pulse. This embodiment has the advantage that with only one AND-gate the reduction of the skew is reached. This AND-gate does not need much space on an integrated circuit and has no severe negative effects on the timing of the circuit, too.

Another embodiment of the invention comprises a DELAY-circuit on the logic circuit. With the help of this DELAY-circuit the clock circuit generated clock pulse is delayed and by that the above mentioned other signal is generated on the logic circuit itself. This has the advantage that not two, but only one clock pulse has to be supplied to the logic circuit. One of the two lines from the clock circuit to the logic circuit, which were necessary until now, can be saved.

BRIEF DESCRIPTION OF THE FIGS.

The invention is subsequently described in connection with FIGS. 5 to 8 of the drawings.

Figure 1:
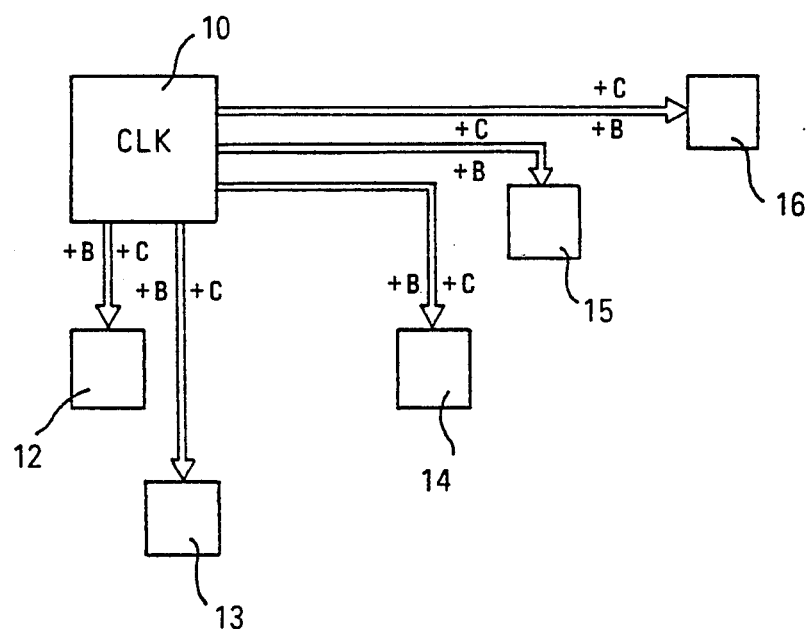
FIG. 1 is a block diagram of a multi-chip computer system.
Figure 2:
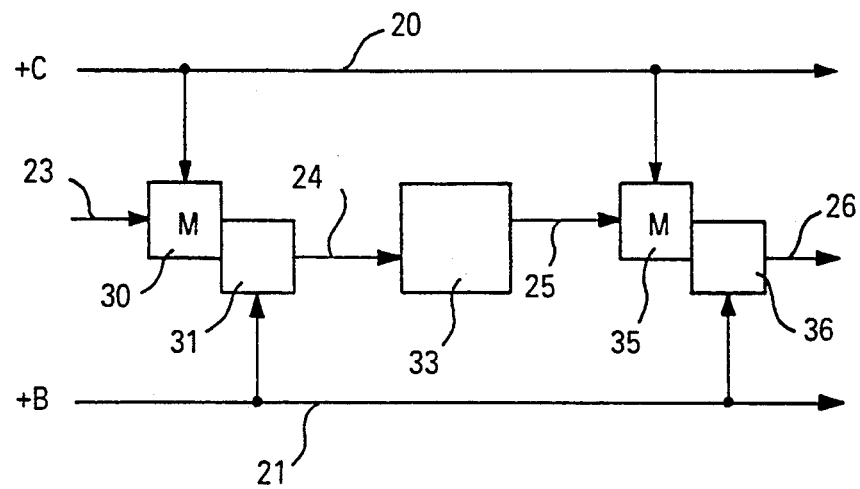
FIG. 2 is a block diagram of a part of one of the logic chips of FIG. 1.
Figure 3:
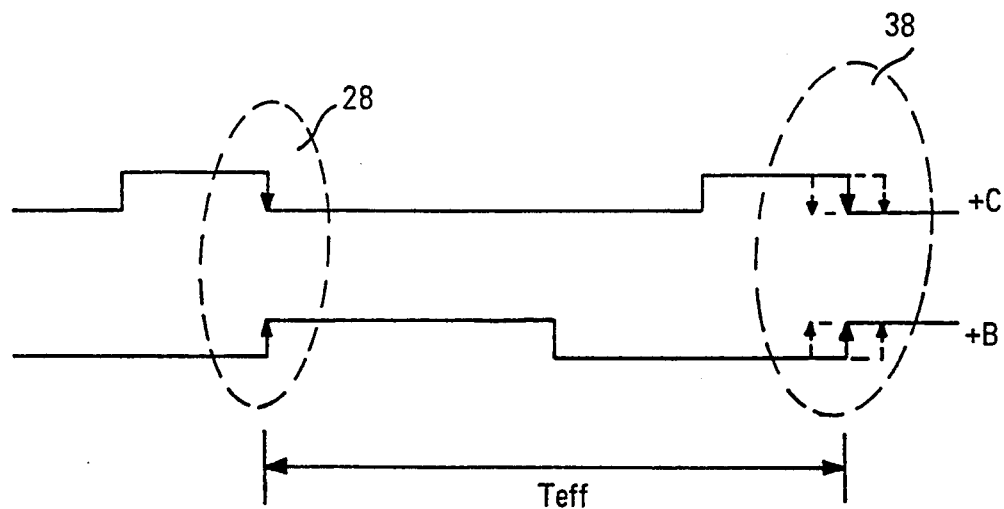
FIG. 3 is a timing diagram of the clock pulses on the logic chip of FIG. 2.
Figure 4A:
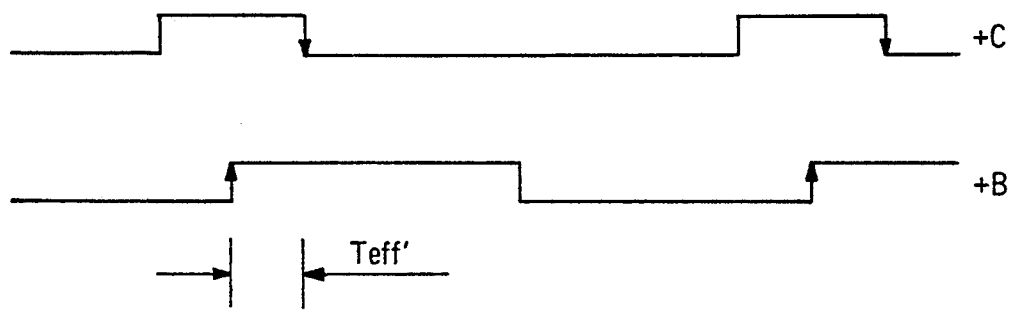
FIGS. 4A and 4B are timing diagrams of the clock pulses of FIG. 3 under special conditions.
Figure 4B:
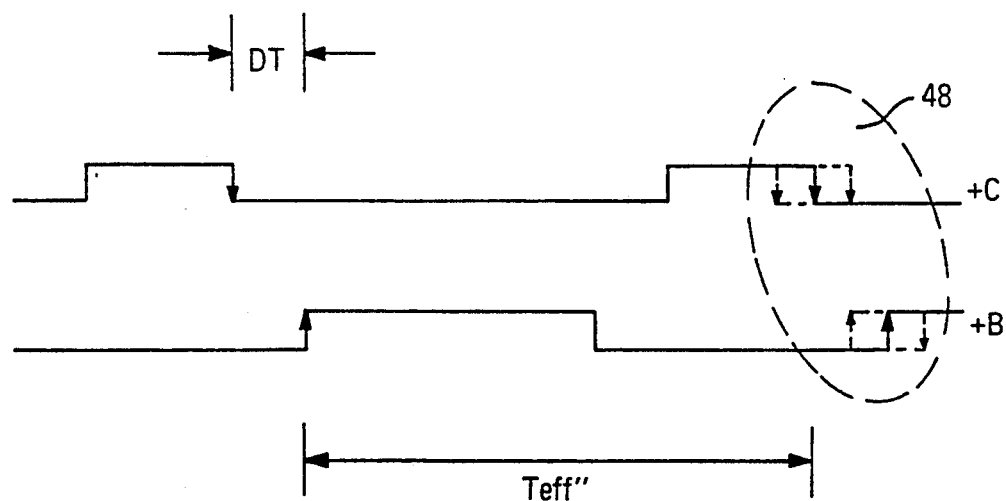
Figure 5:
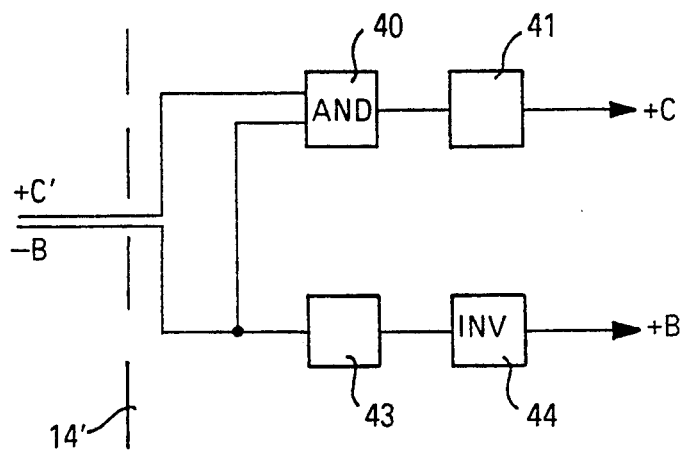
Figure 6:
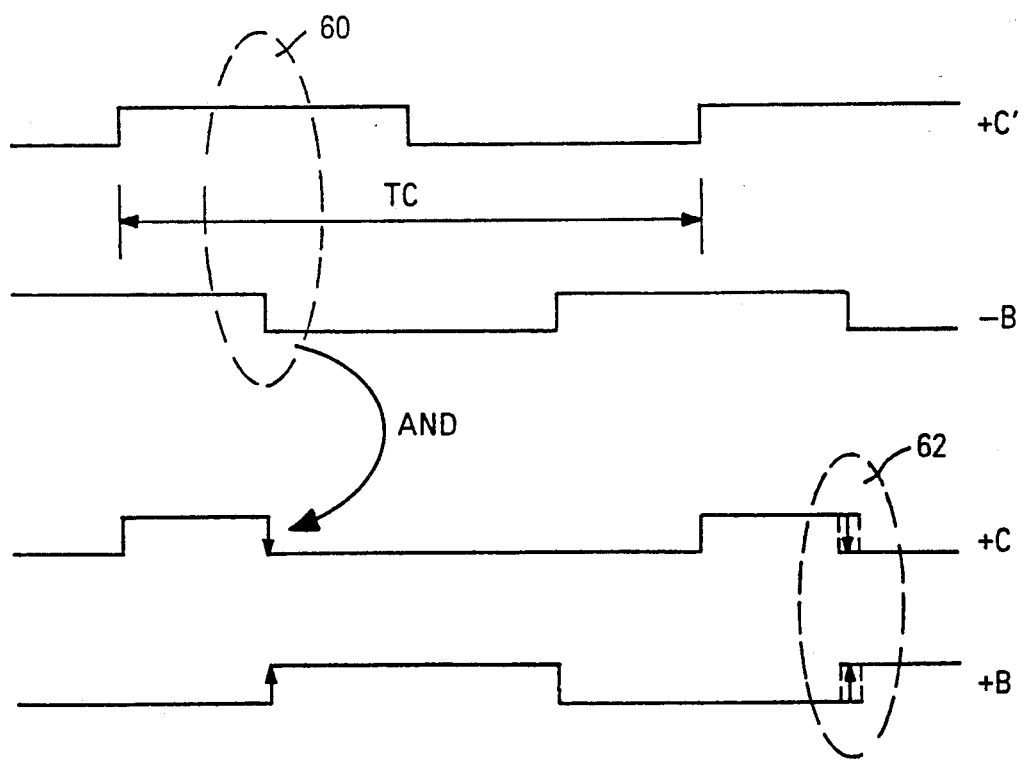
Figure 7:
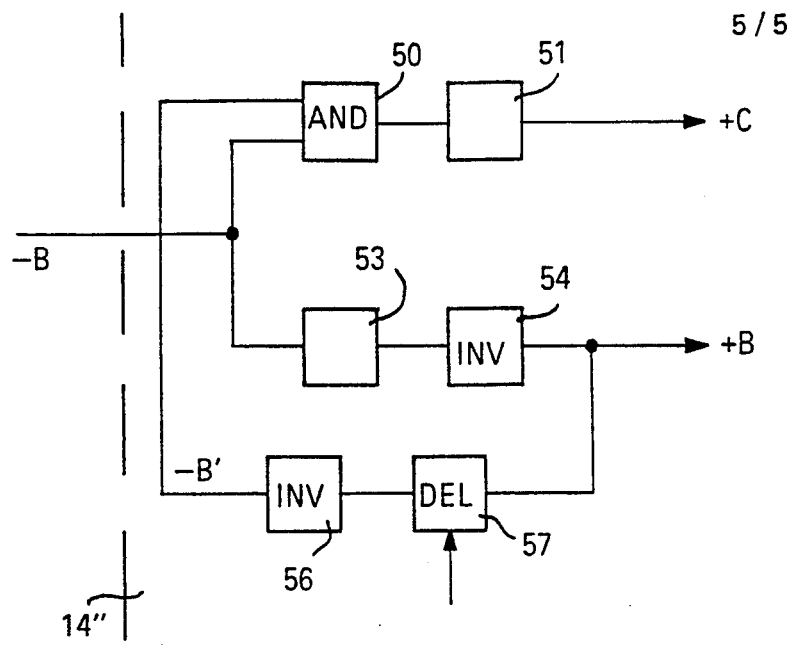
Figure 8:
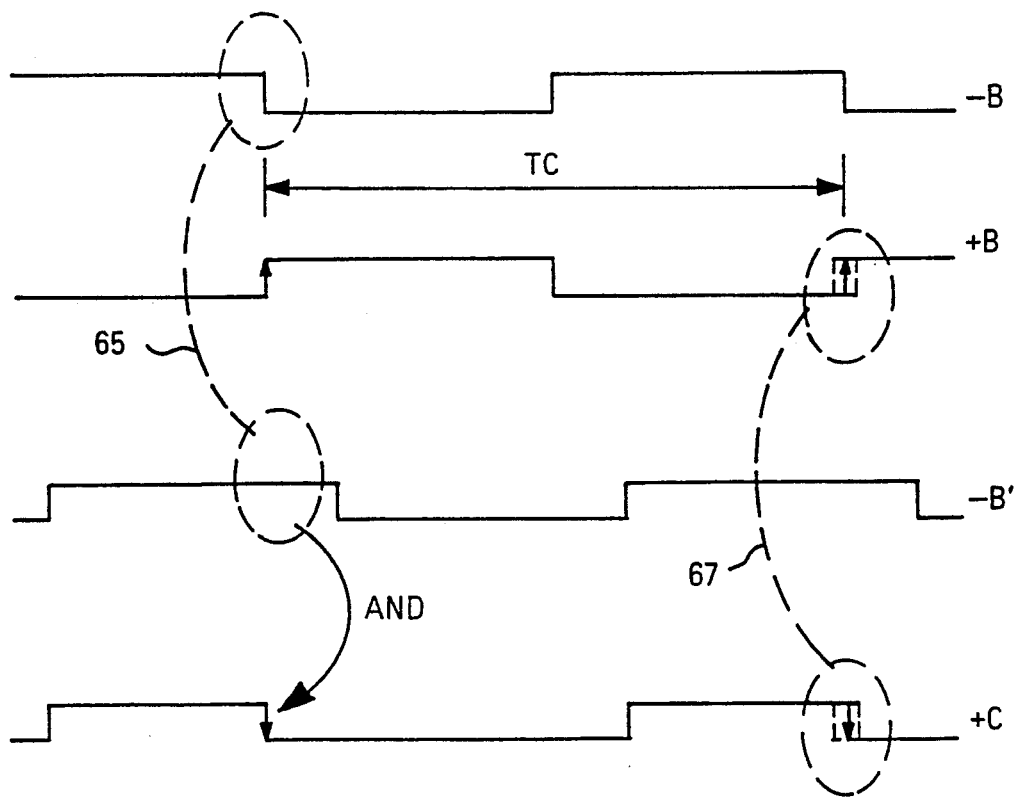

FIG. 5 is a block diagram of a first embodiment of the invention in which both input signals to the AND-gate are supplied to the logic circuit, FIG. 6 is a timing diagram of the first embodiment of the invention, FIG. 7 is a block diagram of a second embodiment of the invention in which only one of the two input signals to the AND-gate is supplied to the logic circuit, FIG. 8 is a timing diagram of the second embodiment of the invention.

DETAILED DESCRIPTION OF THE PREFERRED EMBODIMENT

FIG. 5 shows that an auxiliary clock pulse (+C') and the inversion of the second clock pulse (−B) are supplied from the clock circuit (10) to a logic circuit (14'). This logic circuit (14') contains an AND-gate (40), a buffer (41), a receiver (43) and an INVERSION-gate (44). The AND-gate (40) can additionally contain a receiver and the INVERSION-gate a buffer. The AND-gate (40) is supplied with the auxiliary clock pulse (+C') and the inversion of the second clock pulse (−B) as its input signals. The output of the AND-gate (40) is connected with the input of the buffer (41). The output of the buffer (41) carries the first clock pulse (+C). The receiver (43) is supplied with the inversion of the second clock pulse (−B). The output of the receiver (43) is connected with the input of the INVERSION-gate (44). The output of the INVERSION-gate (44) carries the second clock pulse (+B). FIG. 6 shows the timing diagram of the circuit according to FIG. 5. It can be seen that the auxiliary clock pulse (+C') is a shifted signal compared to the inversion of the second clock pulse (−B). The phase deviation of the auxiliary clock pulse (+C') and the inversion of the second clock pulse (−B) is one fourth of the cycle time (TC) as shown in FIG. 6.

The auxiliary clock pulse (+C') and the inversion of the second clock pulse (−B) are combined by the AND-gate (40). The result is the first clock pulse (+C). This has the effect, that the falling edge of the resulting first clock pulse (+C) is directly derived from the falling edge of the inversion of the second clock pulse (−B) and for that reason the falling edges are almost identical. This is shown in FIG. 6 (see 60).

At the same time, the inversion of the second clock pulse (−B) is inverted by the INVERSION-gate (44) with the second clock pulse (+B) being the result. As a consequence, the falling edge of the first clock pulse (+C) and the raising edge of the second clock pulse (+B) are almost identical, too.

Only a minor skew between the first and the second clock pulse (+C, +B) due to differences in the number of electrical elements and tolerances in the AND-gate (40), the INVERSION-gate (44) etc may remain. This is shown in FIG. 6 (see 62).

FIG. 7 shows that only the inversion of the second clock pulse (−B) is supplied from the clock circuit (10) to a logic circuit (14"). This logic circuit (14") contains an AND-gate (50), a buffer (51), a receiver (53), an INVERSION-gate (54), a DELAY-circuit (57) and another INVERSION-gate (56). The AND-gate (50) can additionally contain a receiver and the INVERSION-gate (54) a buffer. The AND-gate (50) is supplied with the inversion of the second clock pulse (−B) and an auxiliary clock pulse (−B') which is generated on the logic circuit (14") itself. The output of the AND-gate (50) is connected with the input of the buffer (51). The output of the buffer (51) carries the first clock pulse (+C). The receiver (53) is supplied with the inversion of the second clock pulse (-B). The output of the receiver (53) is connected with the input of the INVERSION-gate (54). The output of the INVERSION-gate (54) carries the second clock pulse (+B). This second clock pulse (+B) is supplied to the DELAY-circuit (57). The output of the DELAY-circuit (57) is connected to the INVERSION-gate (56). The output of this INVERSION-gate (56) carries the above mentioned auxiliary clock pulse (−B').

FIG. 8 shows the timing diagram of the circuit according to FIG. 6. It can be seen that the auxiliary clock pulse (−B') is a shifted signal compared to the inversion of the second clock pulse (−B). The phase deviation of the auxiliary clock pulse (−B') and the inversion of the second clock pulse (−B) is about one quarter of the cycle time (TC) as shown in FIG. 8. This deviation can vary as long as the falling edge of the inversion of the second clock pulse (−B) occurs in a range where the auxiliary clock pulse (−B') is a high signal.

The auxiliary clock pulse (−B') and the inversion of the second clock pulse (−B) are combined by the AND-gate (50). The result is the first clock pulse (+C). This has the effect, that the falling edge of the resulting first clock pulse (+C) is directly derived from the falling edge of the inversion of the second clock pulse (−B) and for that reason the falling edges are almost identical. This is shown in FIG. 8 (see 65).

At the same time, the inversion of the second clock pulse (−B) is inverted by the INVERSION-gate (54) with the second clock pulse (+B) being the result. As a consequence, the falling edge of the first clock pulse (+C) and the raising edge of the second clock pulse (+B) are almost identical, too.

Only a minor skew between the first and the second clock pulse (+C, +B) due to differences in the number of electrical elements and tolerances in the AND-gate (50), the INVERSION-gate (54) etc may remain. This is shown in FIG. 8 (see 67).

With the help of the internally generated auxiliary clock pulse (−B') the logic circuit (14") has to be supplied only with the inversion of the second clock pulse (−B).

It is possible to reach the desired delay of the auxiliary clock pulse (−B') only of the running times of the digital signals through the receiver (53), the INVERSION-gate (54), the INVERSION-gate (56) and the feedback-line. In this case, the DELAY-circuit is not necessary any more. Of course, the auxiliary clock pulse (−B') can be generated on the logic circuit (14") in another manner, too. For example, the DELAY-circuit (57) can be directly supplied with the inversion of the second clock pulse (−B). Furthermore, it is possible to generate a special clock pulse for the testing of the computersystem by selecting for example different OR-gates which are supplied with the auxiliary clock signal (−B').

We claim:

1. A computer system comprising:

a clock for generating a series of clock pulses, a period of the clock varying within a limited range;

an AND-gate having an input coupled to receive said series of clock pulses;

a DELAY-circuit coupled to receive and delay said series of clock pulses such that one-level pulses output from said DELAY-circuit overlap one-level pulses of said series of clock pulses input to said DELAY-circuit for all variations of said series of clock pulses, said output of said DELAY-circuit being supplied to another input of said AND-gate;

first and second master-slave latch circuits each comprising a master latch with a master latch clock input coupled to receive an output of said AND-gate, and a slave latch with a slave latch clock input coupled to receive said series of clock pulses; and means for connecting a digital logic circuit between said first and second master-slave latch circuits for processing a data output of said first master-slave latch circuit and providing a data input resulting from said processing to said second master-slave latch circuit; and wherein all of the latches are edge triggered and the slave latches are triggered at approximately the same time as the master latches such that said digital logic circuit has nearly one period of the clock to process the data output from said first master-slave latch circuit and provide the data input to said second master-slave latch circuit.

2. A computer system comprising:

a clock for generating a series of clock pulses, a time of said pulses varying within a limited range;

an AND-gate having an input coupled to receive said series of clock pulses;

a DELAY-circuit coupled to receive and delay said series of clock pulses such that one-level pulses output from said DELAY-circuit overlap one-level pulses of said series of clock pulse input to said DELAY-circuit for all variations of said series of clock pulses, said output of said DELAY-circuit being supplied to another input of said AND-gate;

first and second master-slave latch circuits each comprising a master latch with a master latch clock input coupled to receive an output of said AND-gate, and a slave latch with a slave latch clock input;

an Inverter connected between said clock circuit and the slave latch clock inputs to invert said series of clock pulses en route to said slave latch clock inputs;

means for connecting a digital logic circuit between said first and second master-slave latch circuits for processing a data output of said first master-slave latch circuit and providing a data input resulting from said processing to said second master-slave latch circuit; and wherein the master latch clock inputs are one edge triggered and the slave latch clock inputs are opposite edge triggered and the slave latches are triggered at approximately the same time as the master latches such that said digital logic circuit has nearly one period of the clock to process the data output from said first master-slave latch circuit and provide the data input to said second master-slave latch circuit.

3. A computer system comprising:

a clock for generating a series of clock pulses, a time of said pulses varying within a limited range;

an AND-gate having an input coupled to receive said series of clock pulses;

first and second master-slave latch circuits each comprising a master latch with a master latch clock input coupled to receive an output of said AND-gate, and a slave latch with a slave latch clock input; and a first Inverter connected between said clock circuit and the slave latch clock inputs to invert said series of clock pulses en route to said slave latch clock inputs;

a DELAY-circuit coupled to receive and delay an output of said first Inverter such that zero-level pulses output from said DELAY-circuit overlap one-level pulses input to said DELAY-circuit for all variations of said series of clock pulses;

a second Inverter connected between an output of said DELAY-circuit and said other input to said AND-gate;

means for connecting a digital logic circuit between said first and second master-slave latch circuits for processing a data output of said first master-slave latch circuit and providing a data input resulting from said processing to said second master-slave latch circuit; and wherein all of the latches are edge triggered and the slave latches are triggered at approximately the same time as the master latches such that said digital logic circuit has nearly one period of the clock to process the data output from said first master-slave latch circuit and provide the data input to said second master-slave latch circuit.

4. A computer system comprising:

a clock for generating a series of clock pulses, a time of said pulses varying within a limited range;

an AND-gate having an input coupled to receive said series of clock pulses;

a first buffer coupled to receive an output of said AND-gate;

first and second master-slave latch circuits each comprising a master latch with a master latch clock input coupled to receive an output of said first buffer, and a slave latch with a slave latch clock input;

a second buffer coupled to receive an output of said clock circuit;

a first Inverter connected between said second buffer and the slave latch clock inputs to invert said series of clock pulses form said second buffer en route to said slave latch clock inputs;

a DELAY-circuit coupled to receive and delay an output of said first Inverter such that zero-level pulses output from said DELAY-circuit overlap one-level pulses input to said DELAY-circuit for all variations of said series of clock pulses;

a second Inverter connected between an output of said DELAY-circuit and said other input to said AND-gate;

means for connecting a digital logic circuit between said first and second master-slave latch circuits for processing a data output of said first master-slave latch circuit and providing a data input resulting from said processing to said second master-slave latch circuit; and wherein all of the latches are edge triggered and the slave latches are triggered at approximately the same time as the master latches such that said digital logic circuit has nearly one period of the clock to process the data output from said first master-slave latch circuit and provide the data input to said second master-slave latch circuit.

5. A computer system comprising:

a clock for generating a series of clock pulses, a time of said pulses varying within a limited range;

an AND-gate having an input coupled to receive said series of clock pulses;

a DELAY-circuit coupled to receive and delay said series of clock pulses such that one-level pulses output from said DELAY-circuit overlap one-level pulses of said series of clock pulse input to said DELAY-circuit for all variations of said series of clock pulses, said output of said DELAY-circuit being supplied to another input of said AND-gate;

first and second master-slave latch circuits each comprising a master latch with a master latch clock input coupled to receive an output of said AND-gate, and a slave latch with a slave latch clock input coupled to receive said series of clock pulses; and means for connecting a digital logic circuit between said first and second master-slave latch circuits for processing a data output of said first master-slave latch circuit and providing a data input resulting from said processing to said second master-slave latch circuit; and wherein all of the latches are edge triggered and the slave latches are triggered at approximately the same time as the master latches such that said digital logic circuit has nearly one period of the clock to process the data output from said first master-slave latch circuit and provide the data input to said second master-slave latch circuit.

6. A computer system as set forth in claim 5 wherein a duration of the delay provided by said DELAY-circuit is adjustable.

* * * * *